(12) United States Patent
Kweon et al.

(10) Patent No.: US 11,598,909 B2
(45) Date of Patent: Mar. 7, 2023

(54) LIDAR WINDOW INTEGRATED OPTICAL FILTER

(71) Applicants: Hyundai Motor Company, Seoul (KR); Kia Motors Corporation, Seoul (KR); OPTRONTEC CO., LTD, Changwon-si (KR)

(72) Inventors: Kyoung-Chun Kweon, Seoul (KR); Seon-Yong An, Gangwon-do (KR); Min-Seok Oh, Gyeongsangnam-do (KR); Jang-Seob Kim, Daejeon (KR); Jae-Bum Kim, Gyeonggi-do (KR)

(73) Assignees: Hyundai Motor Company, Seoul (KR); Kia Motors Corporation, Seoul (KR); OPTRONTEC CO., LTD, Changwon-si (KR)

( * ) Notice: Subject to any disclaimer, the term of this patent is extended or adjusted under 35 U.S.C. 154(b) by 510 days.

(21) Appl. No.: 16/782,909

(22) Filed: Feb. 5, 2020

(65) Prior Publication Data
US 2021/0055462 A1  Feb. 25, 2021

(30) Foreign Application Priority Data
Aug. 23, 2019 (KR) .......................... 10-2019-0103924

(51) Int. Cl.
| | |
|---|---|
| *F21V 9/04* | (2018.01) |
| *G02B 5/28* | (2006.01) |
| *G01S 7/481* | (2006.01) |
| *C23C 16/40* | (2006.01) |
| *C23C 28/00* | (2006.01) |
| *G01S 17/00* | (2020.01) |

(52) U.S. Cl.
CPC ............ *G02B 5/282* (2013.01); *C23C 16/402* (2013.01); *C23C 16/405* (2013.01); *C23C 28/42* (2013.01); *G01S 7/481* (2013.01); *G01S 17/003* (2013.01)

(58) Field of Classification Search
CPC ...... G02B 5/282; G02B 5/281; C23C 16/402; G01S 7/481; G01S 17/003
See application file for complete search history.

(56) References Cited

U.S. PATENT DOCUMENTS

2018/0067212 A1\*  3/2018  Wilson .................... H04M 1/02

FOREIGN PATENT DOCUMENTS

| CN | 109932774 B | \* | 8/2021 | ............... G06K 9/20 |
|---|---|---|---|---|
| KR | 101806698 B1 | | 12/2017 | |
| KR | 101903884 B1 | | 9/2018 | |

\* cited by examiner

*Primary Examiner* — Mark Hellner
(74) *Attorney, Agent, or Firm* — Fox Rothschild LLP

(57) ABSTRACT

Disclosed is a LiDAR window integrated optical filter that includes a window of a polymer material for absorbing a visible light band and transmitting a near-infrared band; and an upper reflective layer and a lower reflective layer formed on the upper surface and the lower surface of the window. The upper reflective layer and the lower reflective layer may be formed in a thin film including titanium dioxide ($TiO_2$) and silicon dioxide ($SiO_2$).

16 Claims, 21 Drawing Sheets

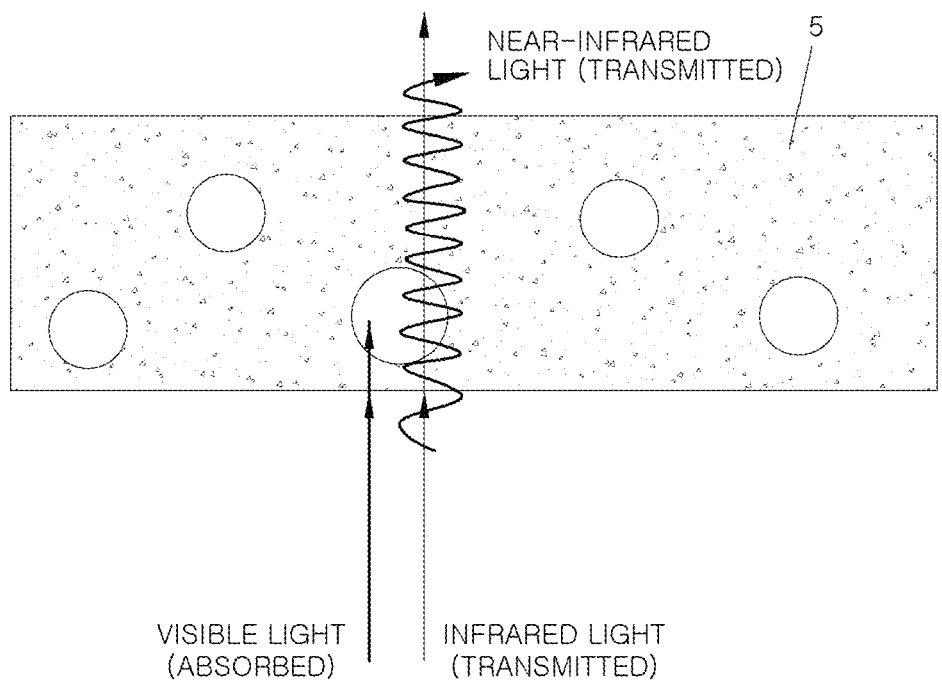

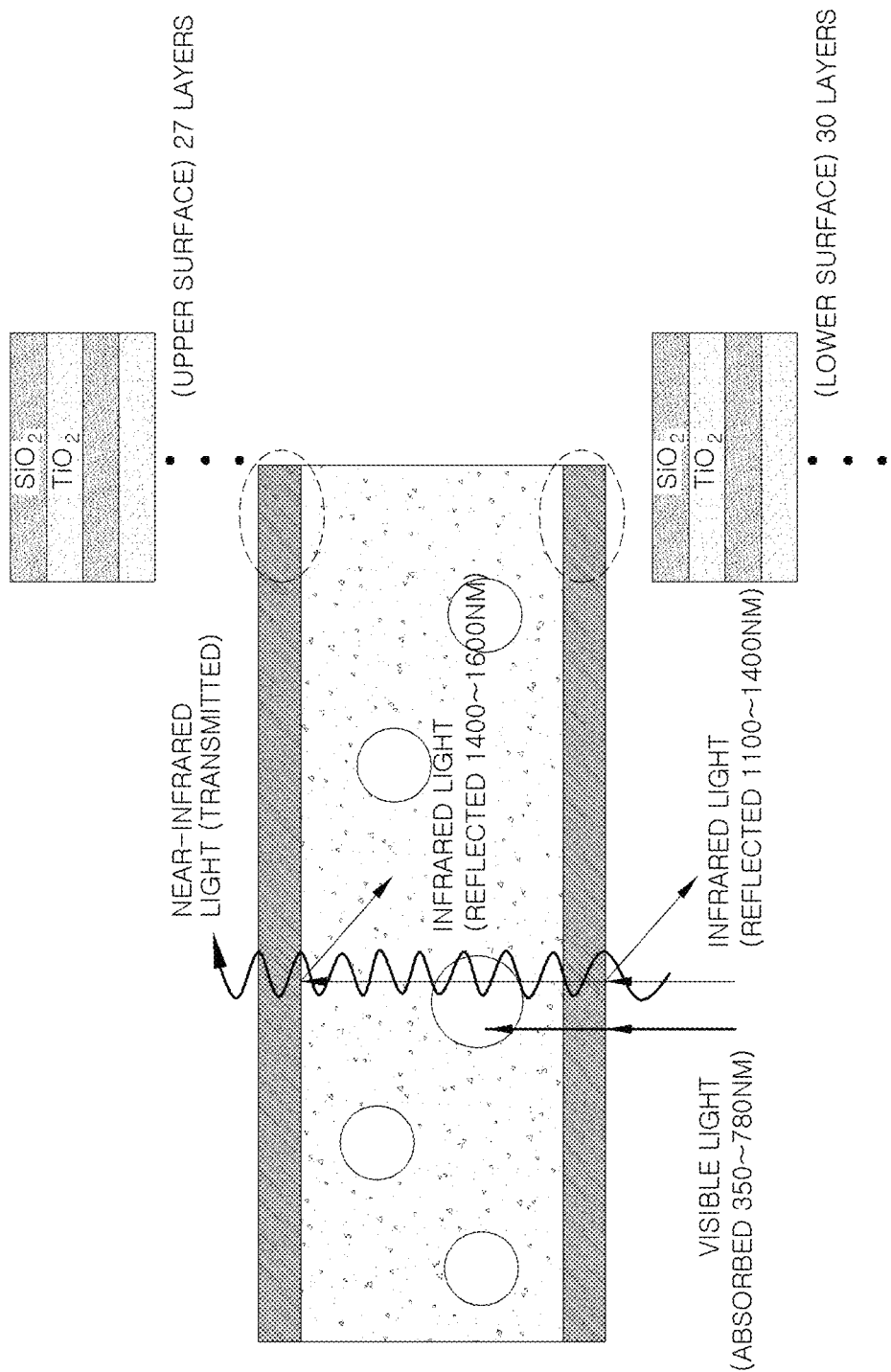

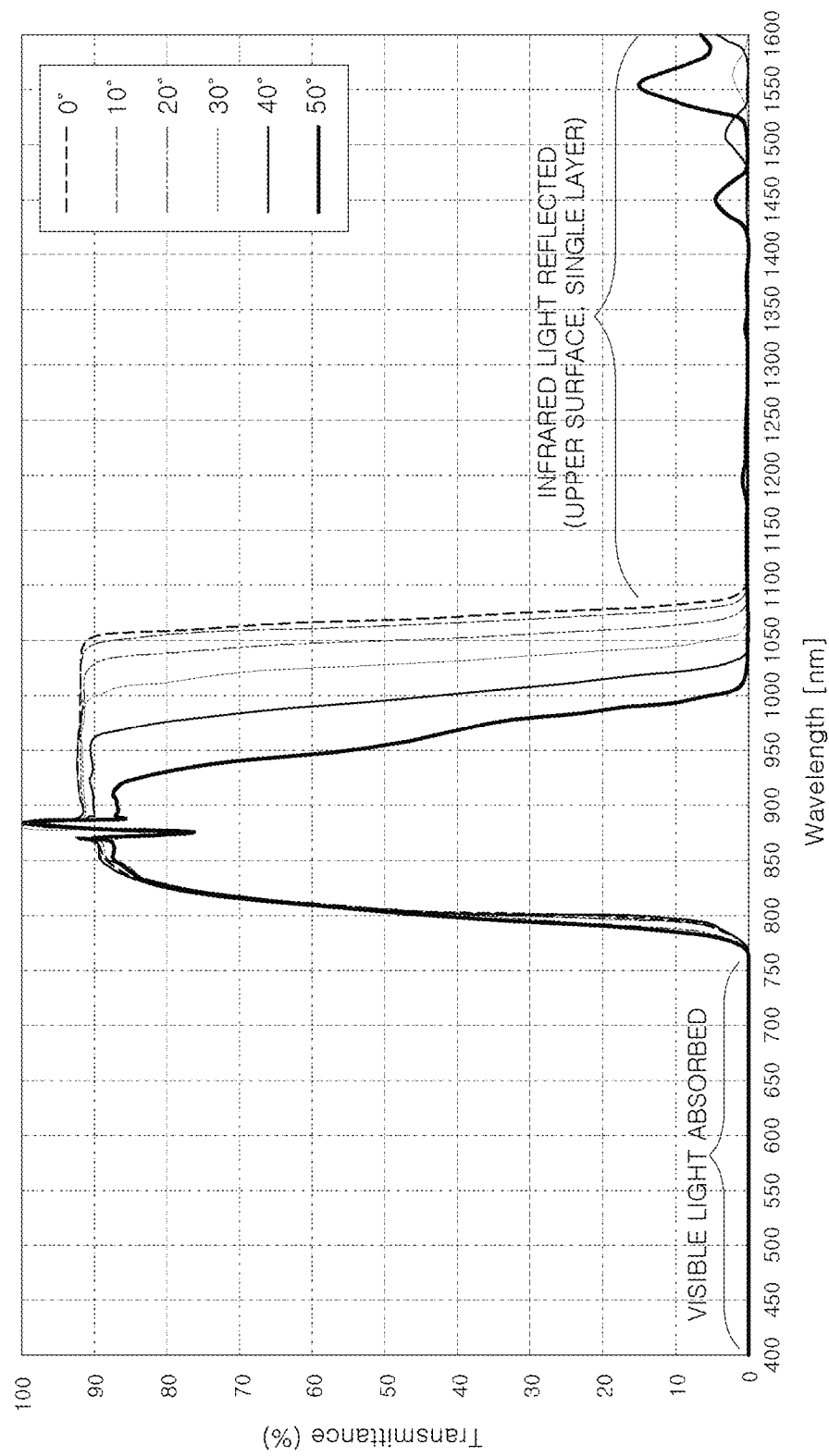

LIDAR WINDOW INTEGRATED OPTICAL FILTER

CROSS-REFERENCE TO RELATED APPLICATION

This application claims priority to Korean Patent Application No. 10-2019-0103924, filed on Aug. 23, 2019, which is incorporated herein by reference in its entirety.

TECHNICAL FIELD

The present invention relates to a light detection and ranging (LiDAR) window integrated optical filter for integrally implementing the functions of an optical filter and a cover constituting a LiDAR system for autonomous driving.

BACKGROUND

An optical filter is conventionally, mainly used in a digital imaging device such as a camera and a smartphone to block near-infrared light so as to implement natural colors as seen by the human eye. Accordingly, an image is implemented by transmitting visible light and blocking near-infrared light to prevent interference of light. However, since a LiDAR component uses infrared light as a main light source, the performance of blocking visible light and transmitting infrared light is very important, unlike an optical filter applied to a camera and a smartphone. The LiDAR component can be used in a Time of Flight method for measuring the distance to an object, for example, by using the time that it takes for the infrared light emitted from the LiDAR component to hit a target and return. For example, as shown in FIG. 1A, in the related art, upper/lower near-infrared absorbing layers 20a, 20b are coated on a transparent substrate 10a having no absorption of visible light with a solution made of a near-infrared absorbing dye and a binder resin and then dried. In addition, near-infrared reflective layers 30a, 30b may be formed on the upper and lower portions of the near-infrared absorbing layer by chemical vapor deposition (CVD). However, the coating thickness may not be uniform because it is made through a solution coating process and the uniform thickness of a thin film on the curved substrate may not be formed. In addition, as shown in FIG. 1B, the light having the wavelength of 905 nm may not be used for the LiDAR because it blocks the near-infrared light.

Next, FIGS. 2A and 2B show an optical filter in the related art having a high blocking rate of visible light and a high transmittance of infrared light. The conventional technology forms a low reflection coating layer 13b on the upper portion of a glass ceramic 11b, and forms a multilayer thin film 12b on the lower portion thereof. However, the substrate of the conventional technology is limited to a glass ceramic, the multilayer thin film is alternately laminated with Si and Ti, the thin film is 10 to 50 layers, and the thickness is 1 μm to 100 μm, thereby increasing the manufacturing cost. In particular, since a glass-based optical filter may be easily broken, it needs to be handled and its mechanical durability is weak, which may cause a problem in that the processing cost of the glass increases when it is manufactured to have the curved surface.

The transmittance at the infrared wavelength in the band of 905 nm to be used in LiDAR is about 89%. In the LiDAR, as shown in FIG. 3A, only the band of 905 nm should be transmitted and the remaining wavelengths should be cut off. That is, there should be a band-pass filter function. Accordingly, in the related art, a wavelength other than the 905 nm signal sent by the LiDAR may be received, thereby causing the malfunction of a sensor.

Meanwhile, in the case of using the optical filter having the characteristics as shown in FIG. 3A, the transmission and reception efficiency of a signal is reduced because the transmittance in the wavelength of 905 nm is low at the level less than 55%.

In addition, the glass-based optical filter as in FIG. 3B requires a band-pass filter function of about ±100 nm based on the center wavelength of 905 nm.

There is a drawback in that the conventional technology so far uses the method for attaching the optical filter deposited with an inorganic material to a glass substrate by separately manufacturing a sensing chip (semiconductor) and an optical filter, thereby increasing the process and the manufacturing cost.

That is, in the LiDAR system, as shown in FIG. 4, an Avalanche Photodiode (APD) chip 1 and an optical filter 2 for the image sensing are configured to be bonded by an adhesive agent 3 at the inside of a plastic cover 4 of the front of a vehicle.

The contents described in Description of Related Art are to help the understanding of the background of the present invention, and may include what is not previously known to those skilled in the art to which the present invention pertains.

SUMMARY

In preferred aspect, provided is a LiDAR window integrated optical filter, which may reduce the manufacturing cost and the process while functioning as an optical filter of a LiDAR system.

A LiDAR window integrated optical filter includes a window including a polymer material; an upper reflective layer formed on an upper surface of the window; and a lower reflective layer formed on a lower surface of the window. The polymer material may suitably absorb a visible light and transmit a near-infrared light. Each of the upper reflective layer and the lower reflective layer may be formed in a film including titanium dioxide ($TiO_2$) and silicon dioxide ($SiO_2$). For example, the film may be formed by laminating a titanium dioxide ($TiO_2$) layer and a silicon dioxide ($SiO_2$) layer. Preferably, such a film layer (including a $TiO_2/SiO_2$ film) is a thin film layer.

In addition, each of the upper reflective layer and the lower reflective layer may be formed in a multilayer film on the window by vapor deposition.

Each of the upper reflective layer and the lower reflective layer may be formed with the thin film by laminating a plurality of $SiO_2$ layers and $TiO_2$ layers.

Furthermore, a thickness of the upper reflective layer may suitably range from about 4 to about 7 μm.

In addition, each of the upper reflective layer may be deposited as a multilayer structure of 25 to 30 layers, and the upper reflective layer reflects infrared light in the wavelength of about 1,400 to 1,600 nm.

In addition, a thickness of the lower reflective layer may suitably range from about 4 to about 7 μm.

In addition, the lower reflective layer may be deposited as a multilayer structure of 25 to 30 layers, and the lower reflective layer reflects infrared light in a wavelength of about 1,100 to 1,400 nm.

Preferably, a thickness difference between the upper reflective layer and the lower reflective layer may be less than about 2 μm.

Meanwhile, the window, may include a transparent plastic material having a visible light absorbing material added thereto, and may suitably have a thickness of about 2 to 4 mm.

The term "transparent" material or "transparent" resin, as used herein, may refer to a material having substantial transmittance of a fraction of light, such as visible light. For instance, substantial amount of visible light such as of about 50%, about 60%, about 70%, about 80%, about 90%, about 95%, about 99%, or greater thereof may transmit or pass through the transparent material or resin.

Accordingly, the transmittance in the wavelength of 905 nm may be about 90% or greater, and the transmittance in the wavelength of 1,550 nm may be about 1% or less.

In an aspect, provided is a LiDAR window integrated optical filter may include a window including a polymer material absorbing visible light in wavelength of about 350 nm to 780 nm, an upper reflective layer laminated on an upper surface of the window to reflect infrared light in a wavelength of about 1,400 to 1,600 nm, and a lower reflective layer laminated on a lower surface of the window to reflect infrared light in a wavelength of about 1,100 to 1,400 nm.

In addition, the transmittance in a wavelength of 905 nm may be about 90% or greater.

In addition, the transmittance in a wavelength of 1,550 nm may be about 1% or less.

According to various exemplary embodiments of the LiDAR window integrated optical filter of the present invention, the light absorption additive and the multilayer thin film may be integrally constituted on the plastic cover of the LiDAR component without being attached to the APD chip, for example, by manufacturing the separate optical filter, thereby functioning as the band-pass filter that the LiDAR window itself performs the function of the 905 nm band-pass filter.

Accordingly, the manufacturing cost and the manufacturing process may be reduced.

In addition, the sensing performance of the LiDAR may be further improved for autonomous driving than before, thereby further ensuring the safety of the driver and the pedestrian.

BRIEF DESCRIPTION OF THE DRAWINGS

FIG. 6A is a diagram showing the optical filter according to a Comparative Example 1.

FIG. 7A is a diagram showing an exemplary optical filter according to an exemplary embodiment of the present invention.

FIG. 10B is a diagram showing the filter characteristics of a Comparative Example 2.

DETAILED DESCRIPTION

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

In order to fully understand the present invention, the operational advantages of the present invention, and the object achieved by the practice of the present invention, reference should be made to the accompanying drawings that exemplify preferred embodiments of the present invention and the contents described in the accompanying drawings.

In describing the various exemplary embodiments of the present invention, well-known techniques or repeated descriptions that may unnecessarily obscure the subject matter of the present invention will be shortened or omitted.

Figure 1A:
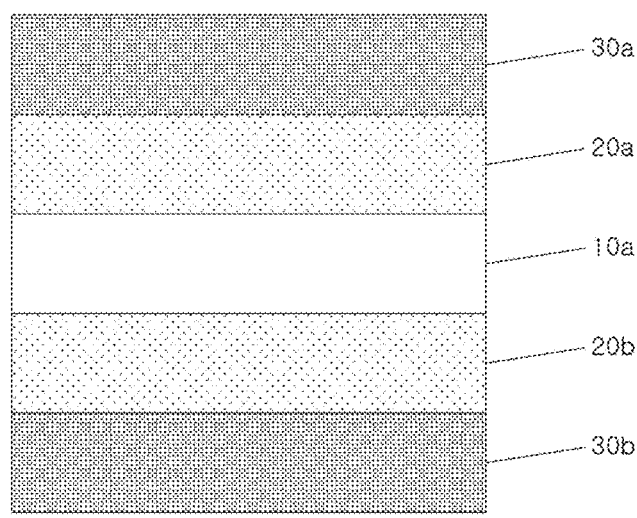
FIGS. 1A to 4 are diagrams for explaining a conventional LiDAR system and optical filter in the related art.
Figure 1B:
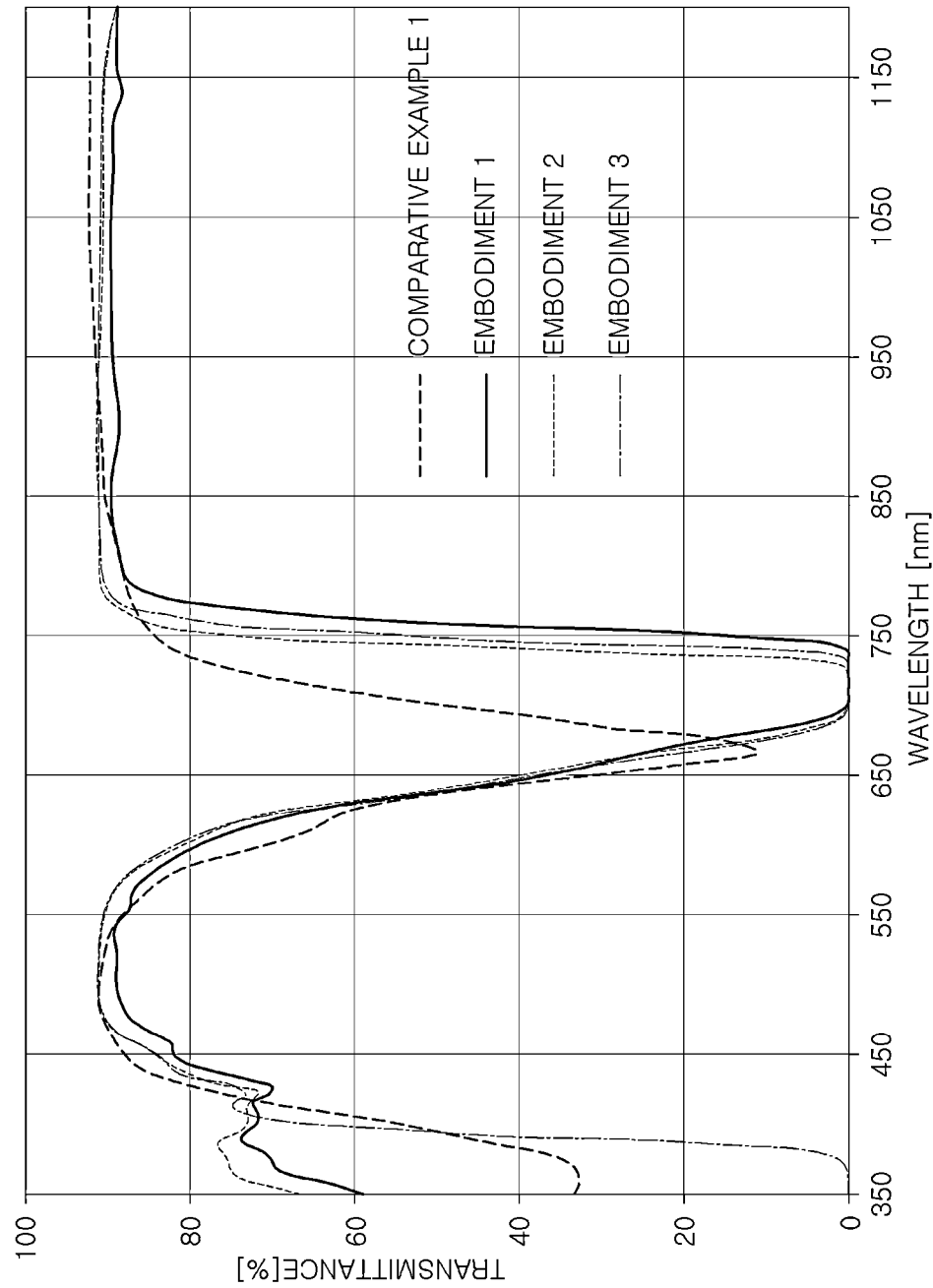
Figure 2A:
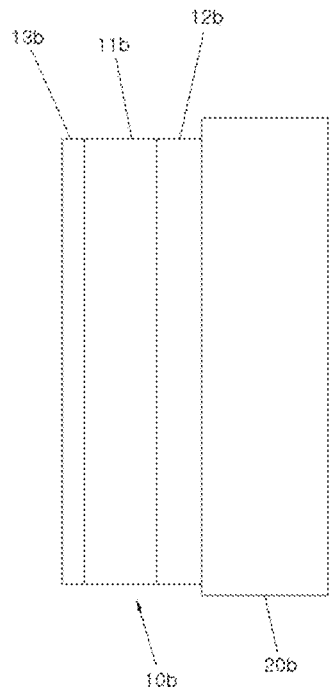
Figure 2B:
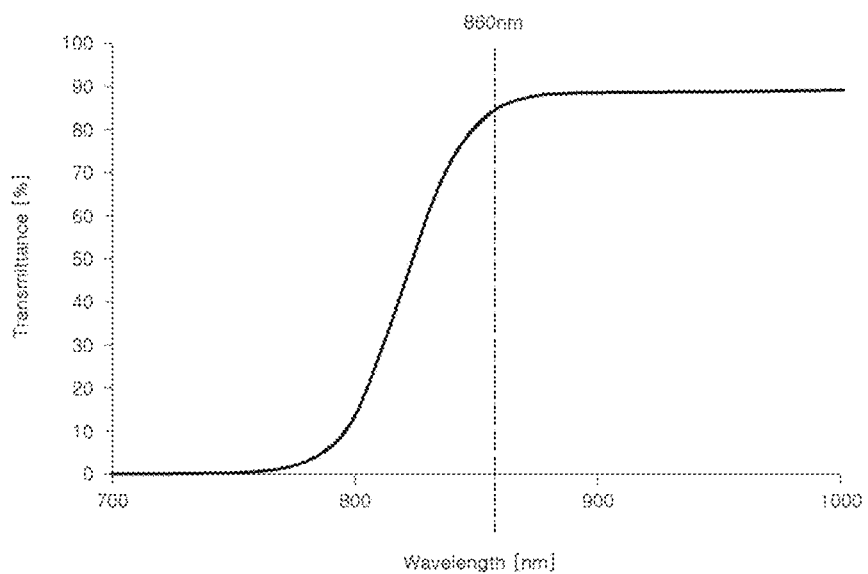
Figure 3A:
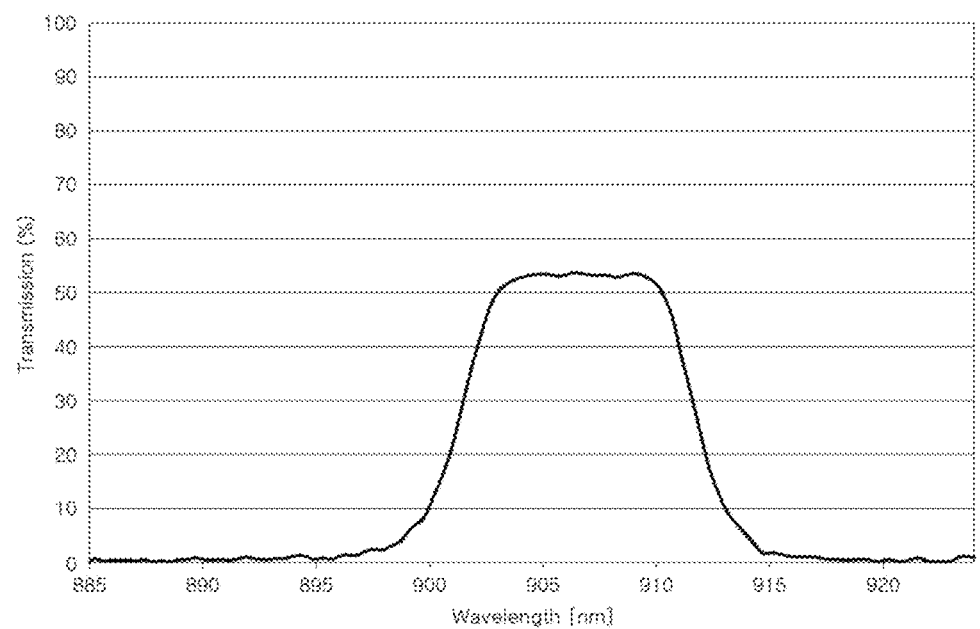
Figure 3B:
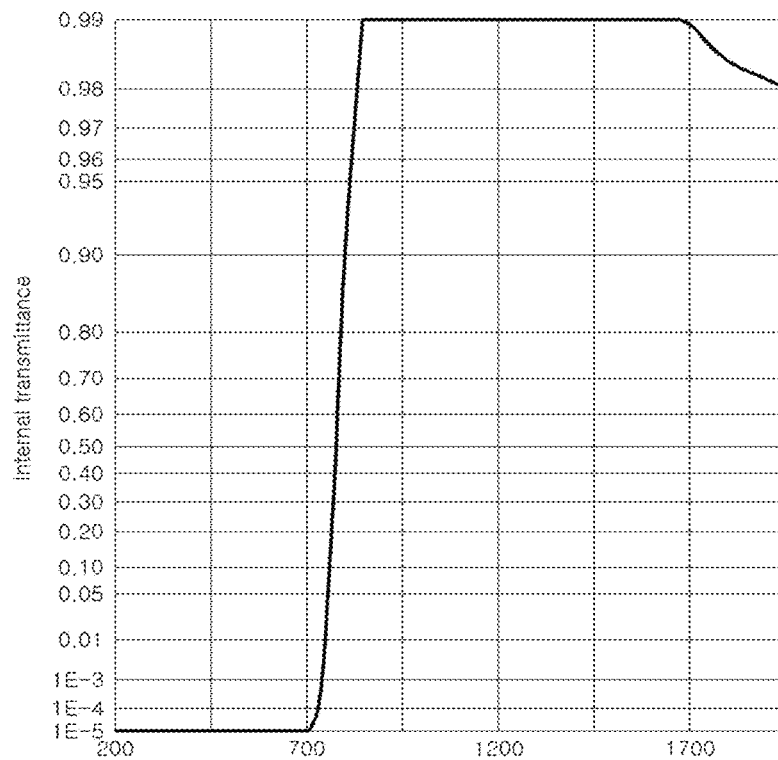
Figure 4:
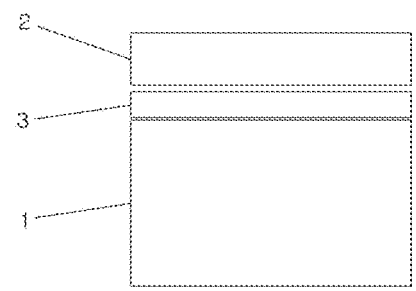
Figure 5:
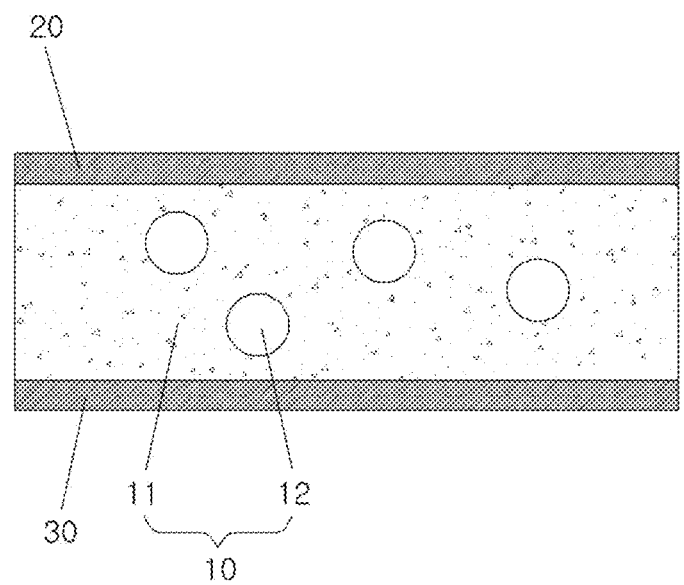
FIG. 5 is a schematic diagram of a LiDAR window integrated optical filter according to an exemplary embodiment of the present invention.

FIG. 5 is a schematic diagram of an exemplary LiDAR window integrated optical filter according to an exemplary embodiment of the present invention.

The LiDAR window integrated optical filter according to an exemplary embodiment of the present invention is for a LiDAR system, and a window integrated optical filter disposed in front of the LiDAR sensor (APD chip), and for simultaneously performing the role of a conventional optical filter and a cover.

The LiDAR is an essential sensor for autonomous driving, and may calculate the distance to a target through a signal that hits the target and returns by using infrared light of the wavelength of 905 nm. Among other things, the optical filter is used to minimize noise interference such as sunlight and other signals from the outside during transmission and reception.

For this purpose, the LiDAR window integrated optical filter of the present invention is configured to include a window 10, an upper reflective layer 20 and a lower reflective layer 30, and the window 10 is a polymer material, and for example, formed of a transparent plastic (11, PC) having a visible light absorbing material added thereto, and the reflective layers 20, 30 are formed of a thin film multilayer deposition film by vacuum deposition.

Accordingly, the visible light may be absorbed by the window 10, and the infrared light of the target wavelength or more may be reflected by the reflective layers 20, 30.

The thicknesses, the number of layers, or the like of the window 10 and the reflective layers 20, 30 are summarized as in Table 1.

TABLE 1

| Window-transparent plastic injection substrate 10 | | Reflective layer - thin film multilayer deposition film | | | |
|---|---|---|---|---|---|
| | | Upper reflective layer 20 | | Lower reflective layer 30 | |
| 905 nm | | | | | |
| Thickness (mm) | transmittance (%) | Thickness (μm) | The number of layers | Thickness (μm) | The number of layers |
| 2 to 4 | 85 to 92 | 4 to 7 | 25 to 30 | 4 to 7 | 25 to 30 |

That is, the thickness of the upper reflective layer 20—thin film multilayer deposition film deposited on the upper portion of the window 10 with $SiO_2$ and $TiO_2$ may be about 4 to 7 μm and 25 to 30 layers.

In addition, the thickness of the lower reflective layer 30—thin film multilayer deposition film deposited on the lower portion of the window 10 with $SiO_2$ and $TiO_2$ may be about 4 to 7 μm and 25 to 30 layers.

The thickness difference between the upper reflective layer 20 and the lower reflective layer 30 may be less than about 2 μm, because bending may occur when the thickness difference is about 2 μm or greater.

In addition, the window 10 may suitably have the transmittance of 85 to 92% at the wavelength of 905 nm with the thickness of about 2 to 4 mm.

Furthermore, the surface of the upper reflective layer 20 may constitute a low reflective coating material, a hard coating, or the low reflective coating and the hard coating at the same time.

Figure 6B:
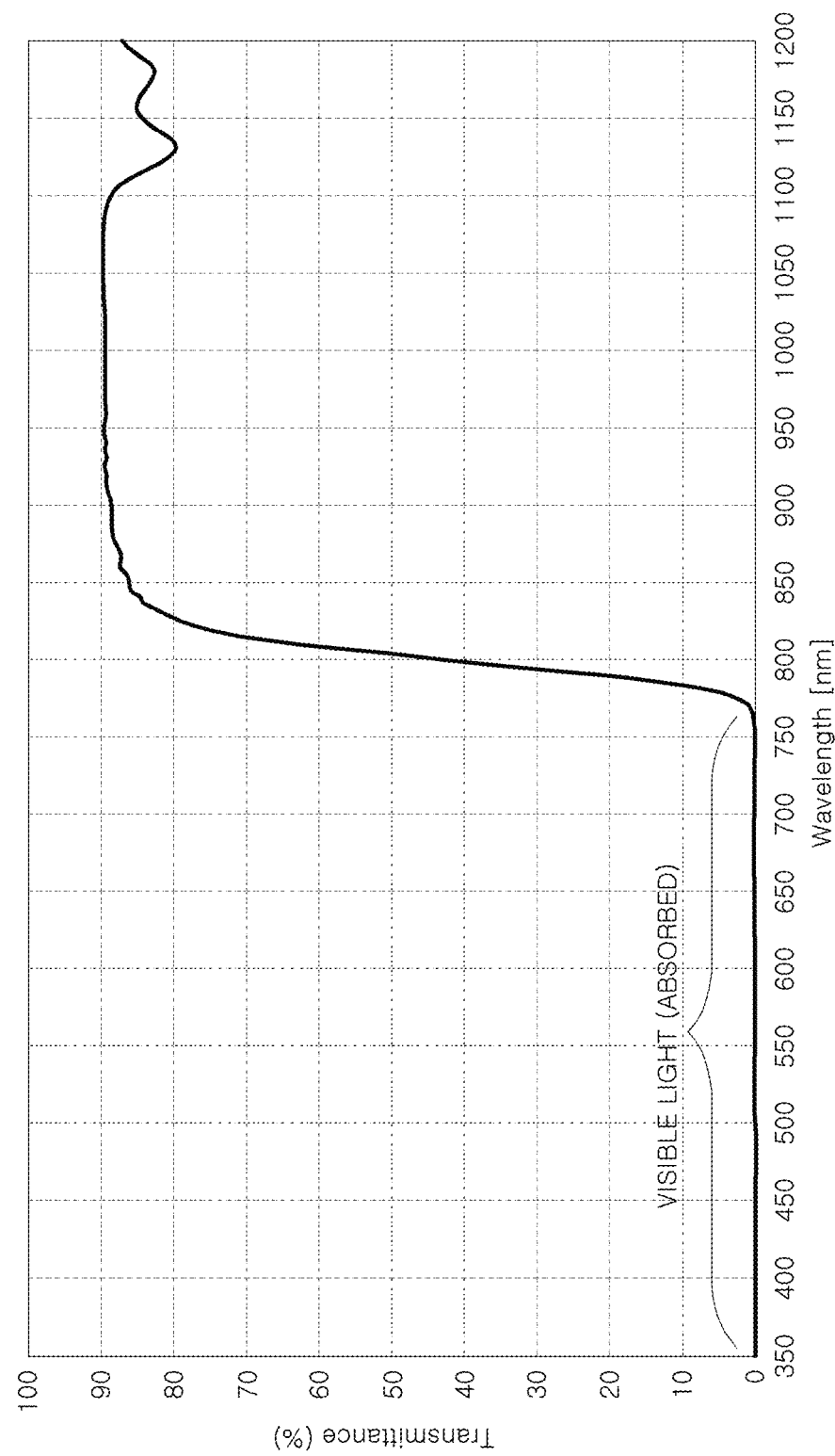
FIG. 6B is a diagram showing the filter characteristics according to the Comparative Example 1.

When describing more in detail with reference to FIGS. 6A to 7B, infrared light is transmitted and only visible light are absorbed when only the visible light absorbing material is added to a base plastic (polycarbonate, 5) without the infrared reflective deposition film as shown in FIG. 6A, such that it is impossible to implement a band-pass filter as in FIG. 6B.

Figure 7B:
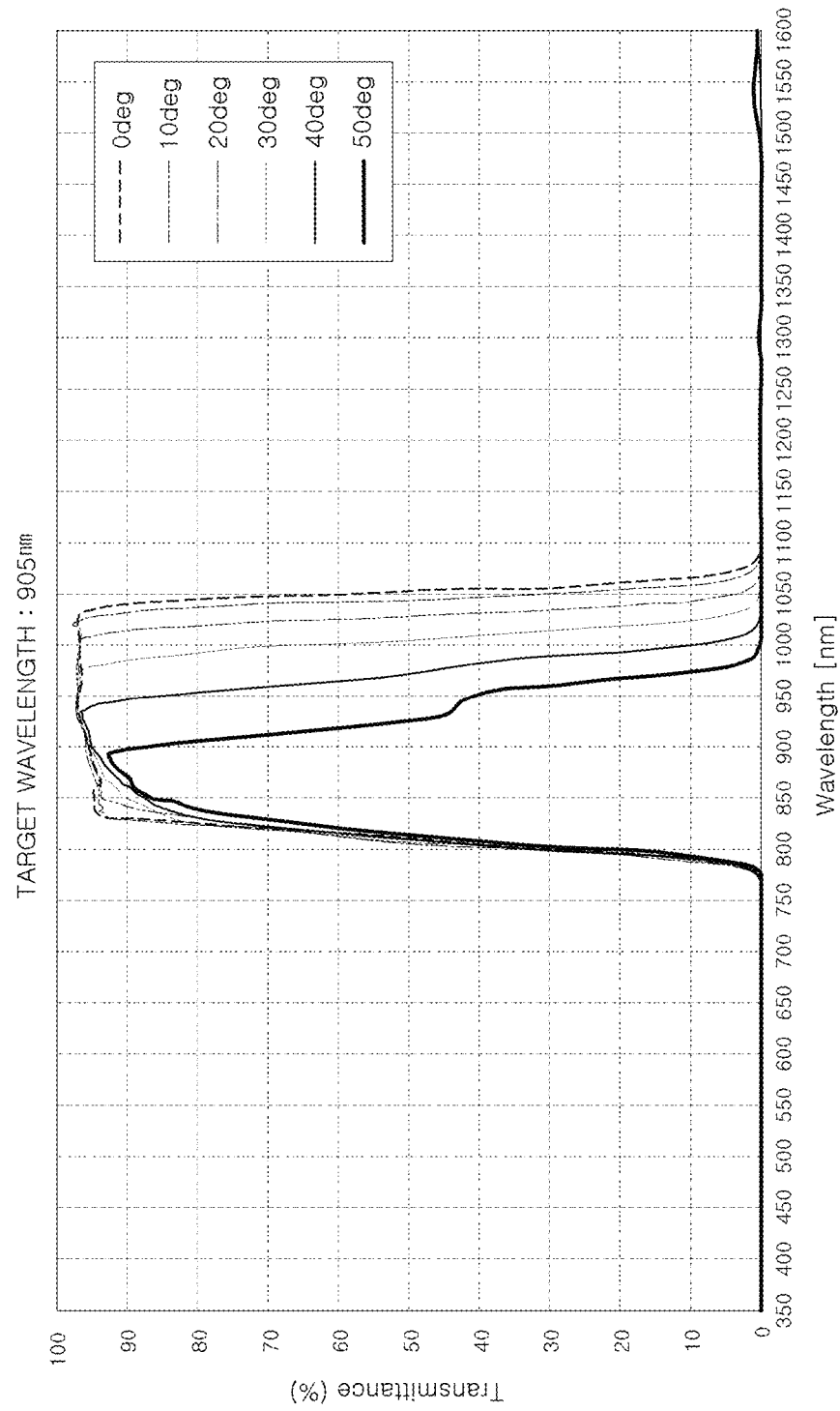
FIG. 7B is a diagram showing exemplary filter characteristics according to an exemplary embodiment of the present invention.

On the contrary, in the case of the LiDAR window integrated optical filter according to an exemplary embodiment of the present invention shown in FIG. 7A, the infrared band may be reflected according to the type, thickness, number of layers of each deposition film corresponding to the upper reflective layer 20 and the lower reflective layer 30, such that it is possible to implement the band-pass filter having a high transmittance around the wavelength of 905 nm as in FIG. 7B. Since the LiDAR window integrated optical filter has a high transmittance of about 90% or greater in the wavelength between 825 nm and 1,025 nm, it is suitable for the LiDAR system.

In particular, since the transmittance of the wavelength of 905 nm used for the LiDAR is about 90% or greater and the transmittance of the wavelength of 1,550 nm is about 0.1%, there is no noise crosstalk with the LiDAR using the band of 1,550 nm.

In the example, the lower reflective layer 30 may be deposited with 30 layers of $SiO_2$ and $TiO_2$ to reflect the wavelength of about 1,100 to 1,400 nm, and the upper reflective layer 20 may be deposited with 27 layers of $SiO_2$ and $TiO_2$ to reflect the wavelength of about 1,400 to 1,600 nm.

Figure 8A:
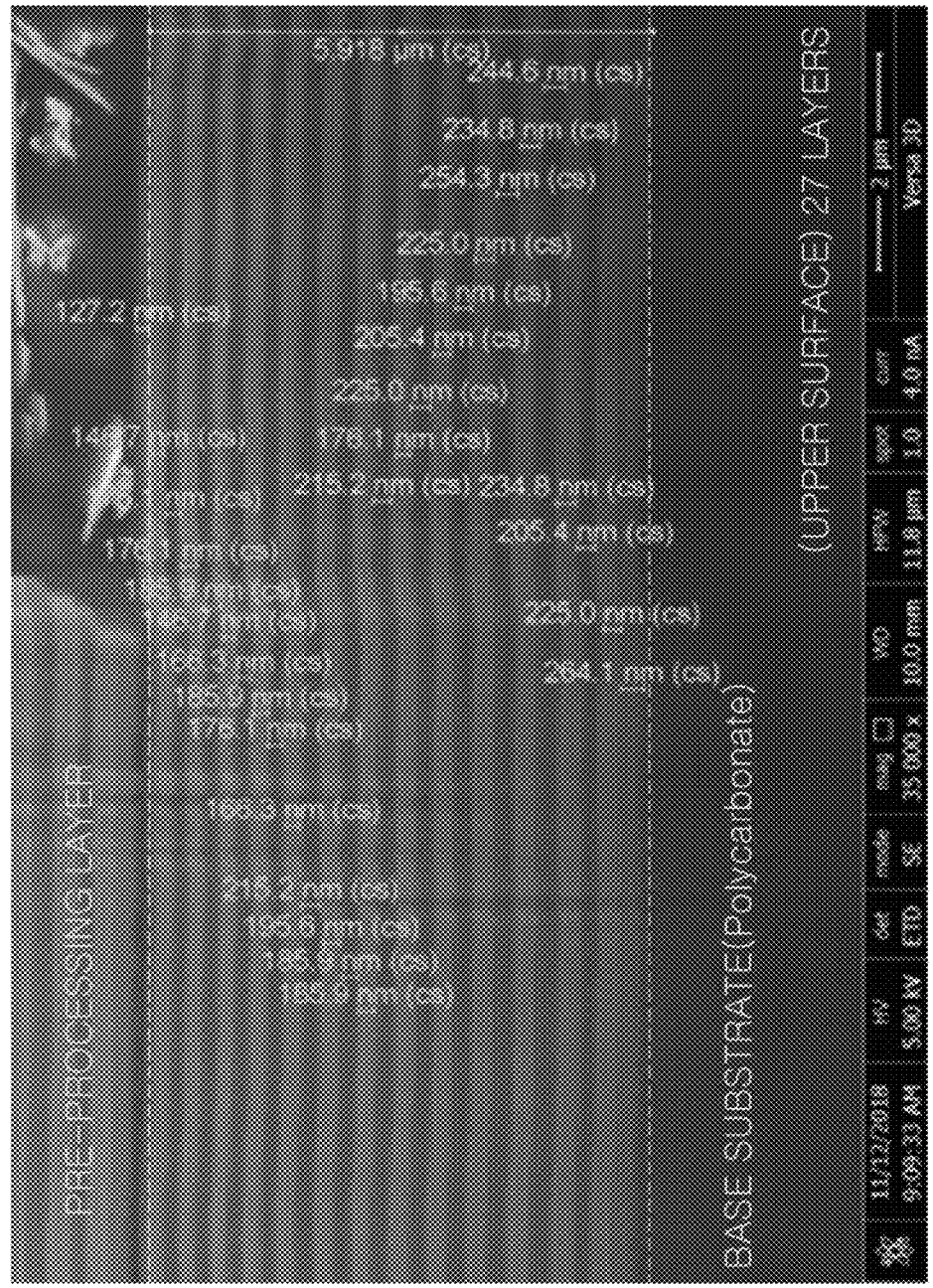
FIG. 8A is a diagram showing an exemplary upper surface of an exemplary multilayer structure of an exemplary optical filter according to an exemplary embodiment of the present invention.
Figure 8B:
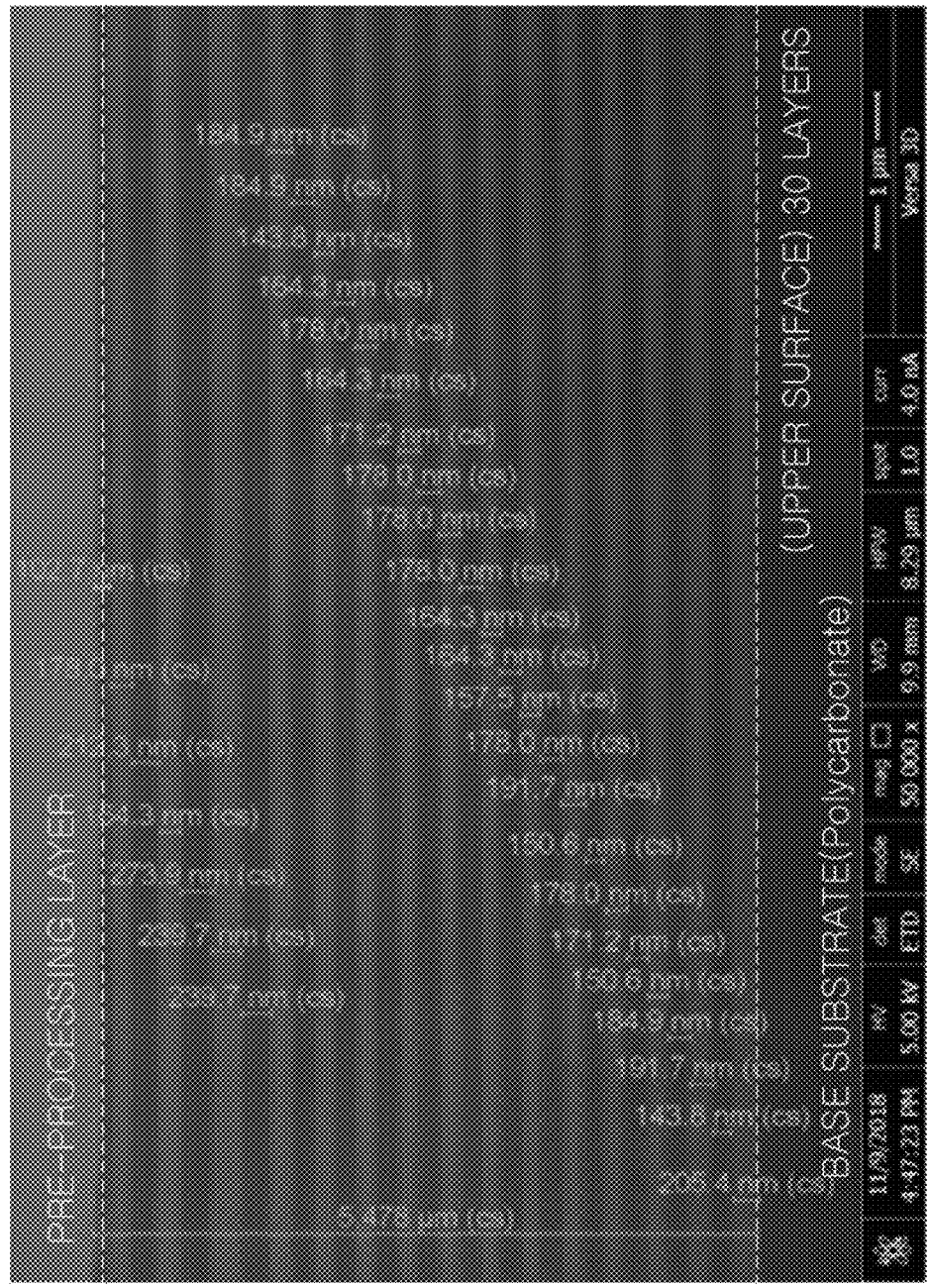
FIG. 8B is a diagram showing an exemplary lower surface of an exemplary multilayer structure of an exemplary optical filter according to an exemplary embodiment of the present invention.
Figure 9:
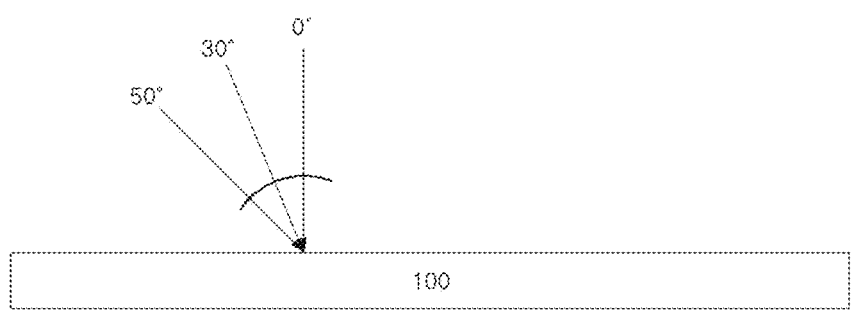
FIG. 9 is a diagram showing an incident angle of 95 nm band infrared laser incident on an exemplary LiDAR window integrated optical filter of the present invention.

FIGS. 8A and 8B are a structure of the multilayer film analyzed through FIB/SEM, a pre-processing layer may be a temporary layer used for analysis, FIG. 8A corresponds to the upper surface of the multilayer film structure of the optical filter, and FIG. 8B corresponds to the lower surface of the multilayer film structure of the optical filter. What is marked between the pre-processing layer and the base material is the actual infrared reflective layer. In FIG. 8A, the actual thickness is 5,918 μm, and in FIG. 8B, the actual thickness is 5,478 μm. Meanwhile, incident light is incident on a LiDAR window integrated optical filter 100 at a constant angle as shown in FIG. 9.

Accordingly, it is important to maintain the transmittance of 95% or greater in the wavelength of 905 nm even when the incident light changes from 0 degrees to 40 degrees. In addition, it is important that the transmittance in the wavelength of 1,550 nm is within 1%, and it may be achieved by the present invention.

Figure 10A:
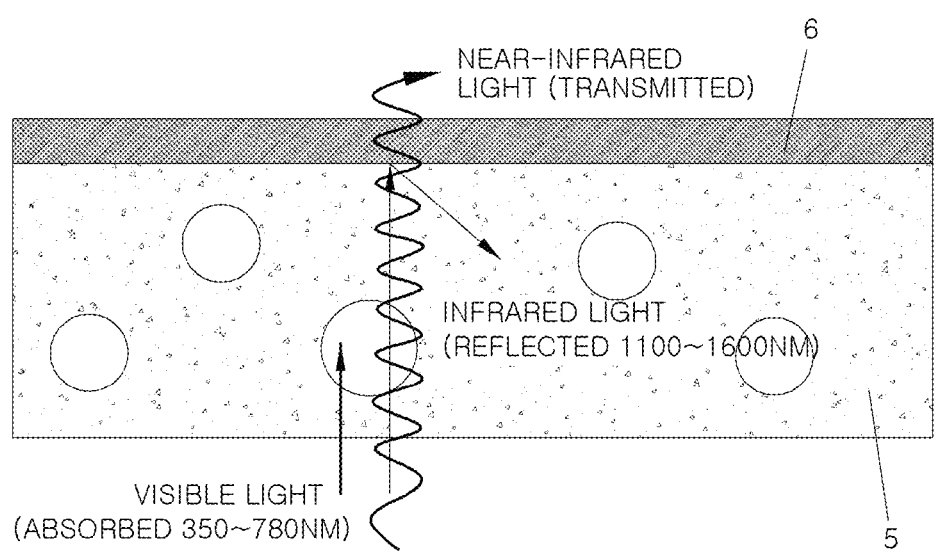
FIG. 10A is a diagram showing the optical filter according to a Comparative Example 2.

FIG. 10A shows the optical filter according to a Comparative Example 2, and FIG. 10B shows the filter characteristics of the Comparative Example 2. The Comparative Example 2 is a case where the infrared reflective layer 6 is formed only on one surface of the base plastic 5, and since infrared reflection is performed on the wide area from 1,100 nm to 1,600 nm in order to show the band-pass characteristics by the Comparative Example 2, the infrared reflective layer 6 has no choice but to increase the number of layers of the deposition film. For example, the thickness of 59 layers and about 10,202 μm may be required.

In order to form a thick deposition film having a large number of layers, the plastic base 5 having a relatively low heat deformation temperature in a high temperature deposition process is exposed, thereby occurring bending.

Figure 10C:
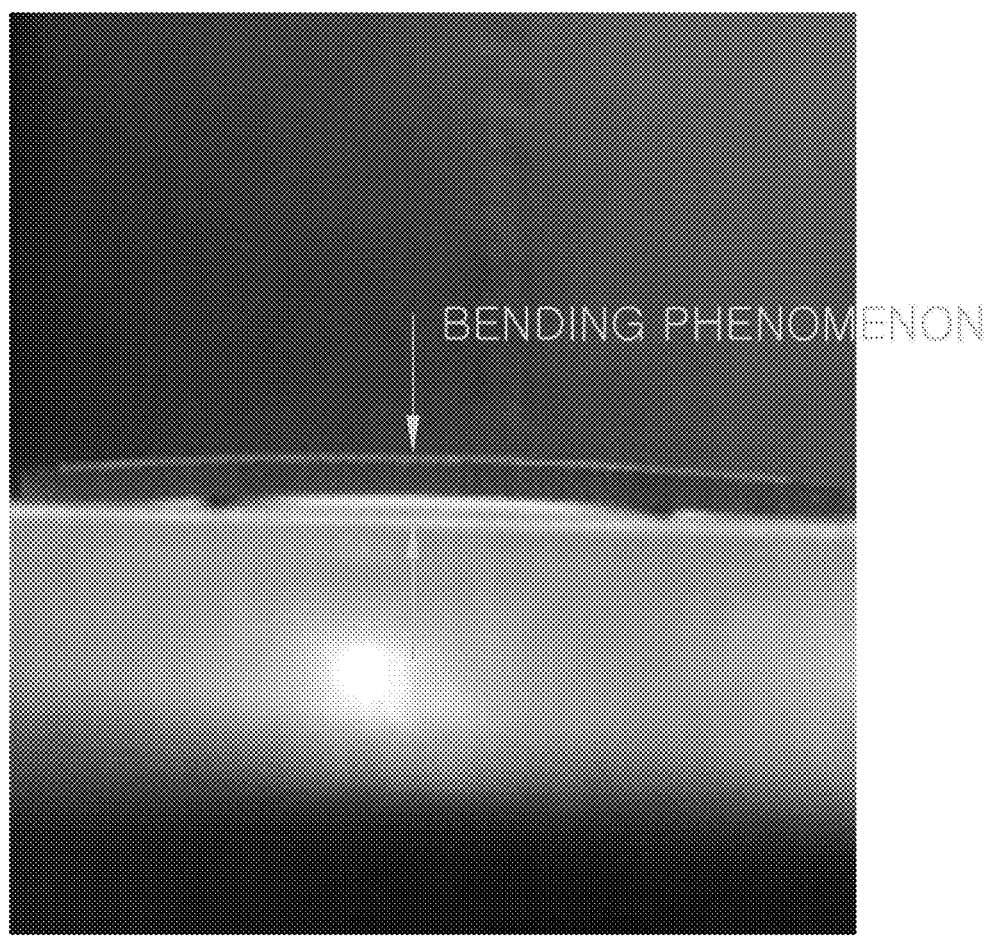
FIGS. 10C and 10D are diagrams showing the bending phenomenon of the Comparative Example 2.
Figure 10D:
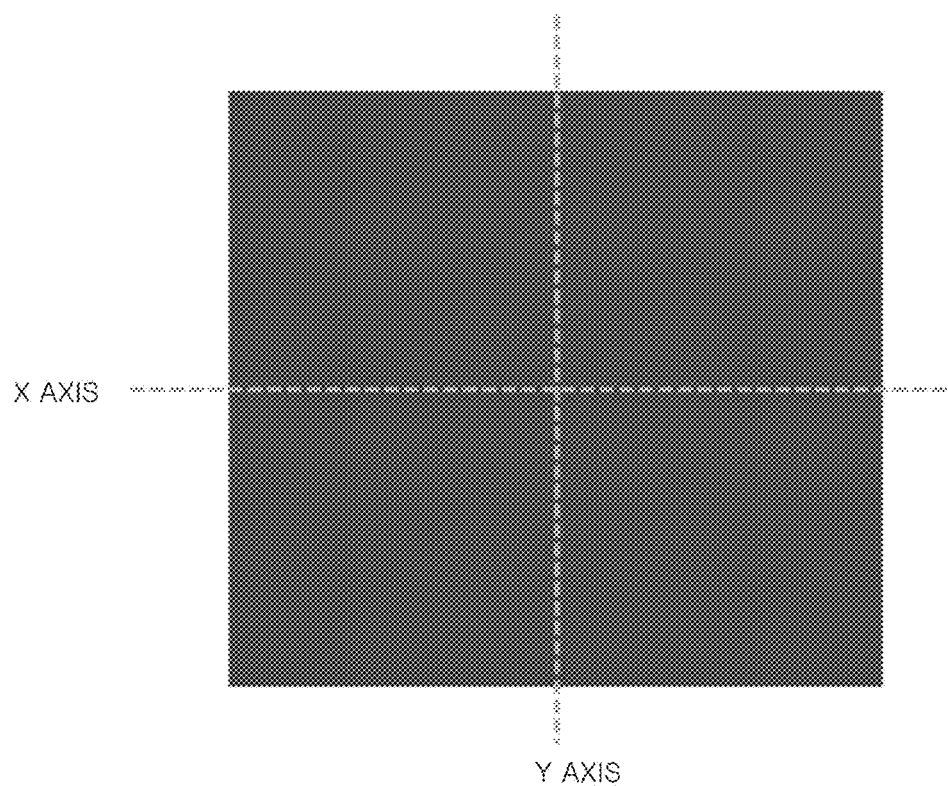

FIG. 10C shows that such a bending phenomenon has occurred, FIG. 10D shows the reference of FIG. 10C, and this is summarized as in Table 2. In the experiment, it was confirmed that the thickness of the base plastic was 2 mm, and the average bending of 286 μm occurred.

TABLE 2

| Items | Front Side (concave) | | Back Side (convex) | | Average |
|---|---|---|---|---|---|
| | X-axis(μm) | Y-axis(μm) | X-axis(μm) | Y-axis(μm) | X, Y-axes(μm) |
| Before coating | 8.0 | 4.5 | 28.0 | 8.0 | ±6.1 |
| After coating | 600.0 | 510.0 | 570.0 | 610.0 | ±286.25 |

In addition, when the deposition film is formed only on one surface, it may be confirmed that the transmittance is about 15% when the incident angle is 50 degrees in the band of 1,550 nm. That is, since the noise signal of the LiDAR using the band of 1,550 nm may pass through as it is, distortion of the LiDAR signal occurs due to the bending.

Figure 11A:
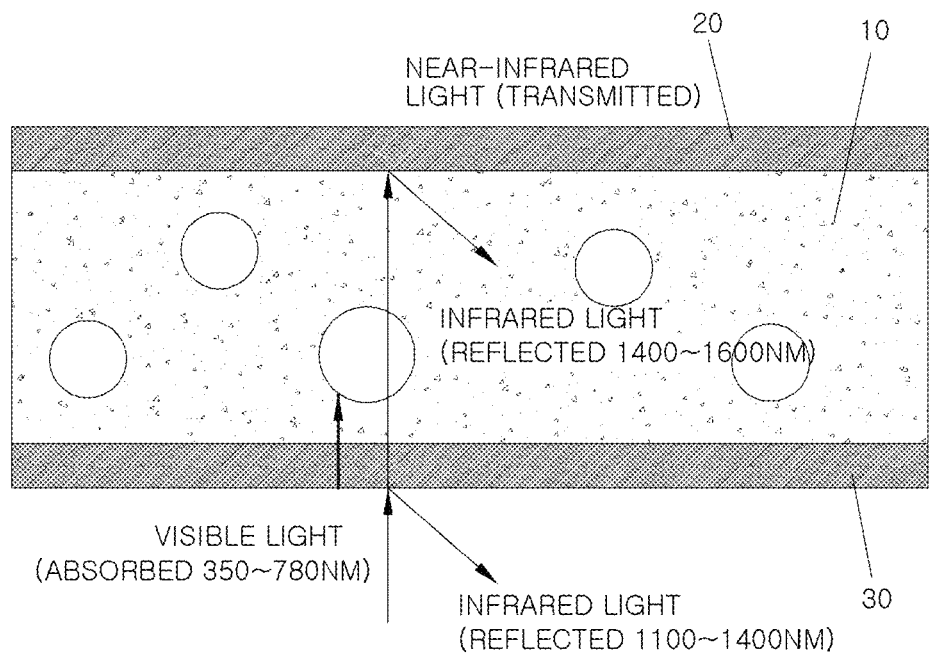
FIG. 11A is a diagram showing an exemplary optical filter according to an exemplary embodiment of the present invention for comparison with the Comparative Example 2.
Figure 11B:
FIGS. 11B and 11C are diagrams showing whether the optical filter according to an embodiment of the present invention has been bent.
Figure 11C:
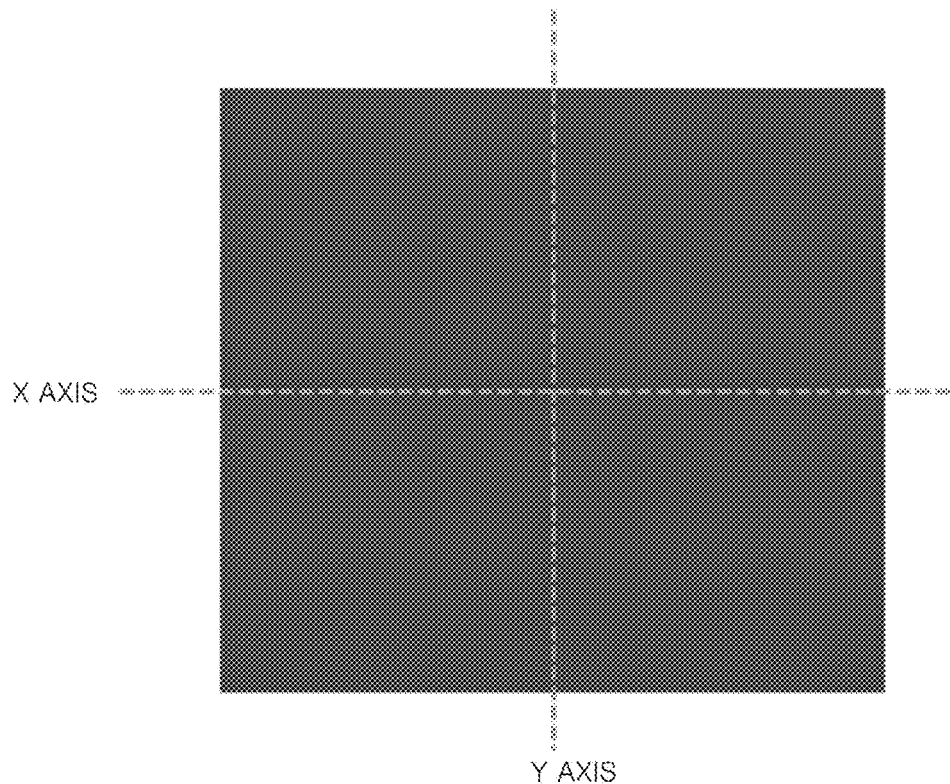

An object of the present invention is to have a high transmittance at 905 nm and to have a low transmittance at 1,550 nm, and the object is not achieved by the configuration as in the Comparative Example 2. On the contrary, FIG. 11A shows the optical filter according to an embodiment of the present invention, FIGS. 11B and 11C show whether the optical filter according to an exemplary embodiment of the present invention is bent, and this is summarized as in Table 3. In the experiment, it was confirmed that the thickness of the base plastic was 2 mm, and the average bending of 286 μm occurred.

TABLE 3

| Items | Front Side (concave) | | Back Side (convex) | | Average |
| --- | --- | --- | --- | --- | --- |
| | X-axis (μm) | Y-axis (μm) | X-axis (μm) | Y-axis (μm) | X, Y-axes(μm) |
| Before coating | 8.0 | 4.5 | 28.0 | 8.0 | ±6.1 |
| After coating | 140.0 | 50.0 | 200.0 | 40.0 | ±53.7 |

As may be seen from Table 3, when the reflective layer is deposited on the upper surface and the lower surface as in the present invention, the bending after deposition may be insignificant to about 53 μm even at the thickness of 2 mm to minimize the bending phenomenon, thereby not affecting the LiDAR signal.

Figure 12:
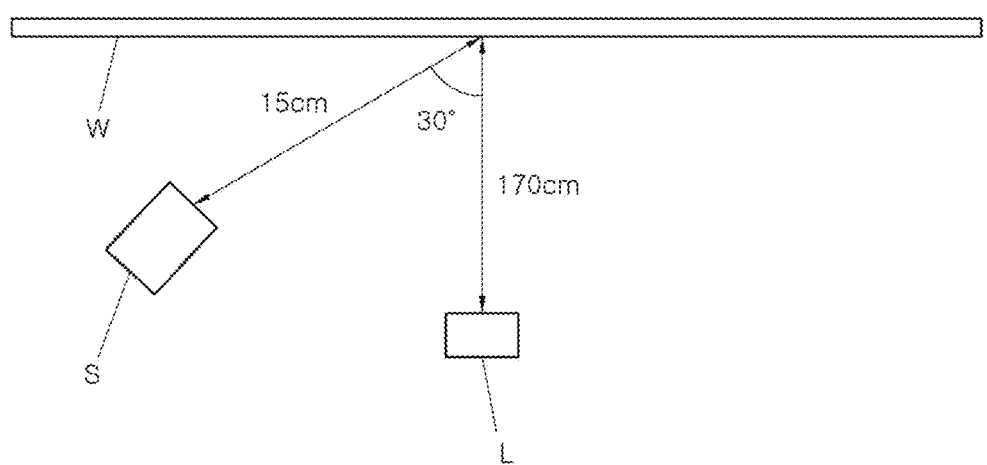
FIG. 12 is a diagram showing a configuration for the teat evaluation of the LiDAR window integrated optical filter.

FIG. 12 is an experimental configuration for evaluating the sensing (signal sensing) capability of the LiDAR when the LiDAR window integrated optical filter of the present invention is applied.

Figure 13A:
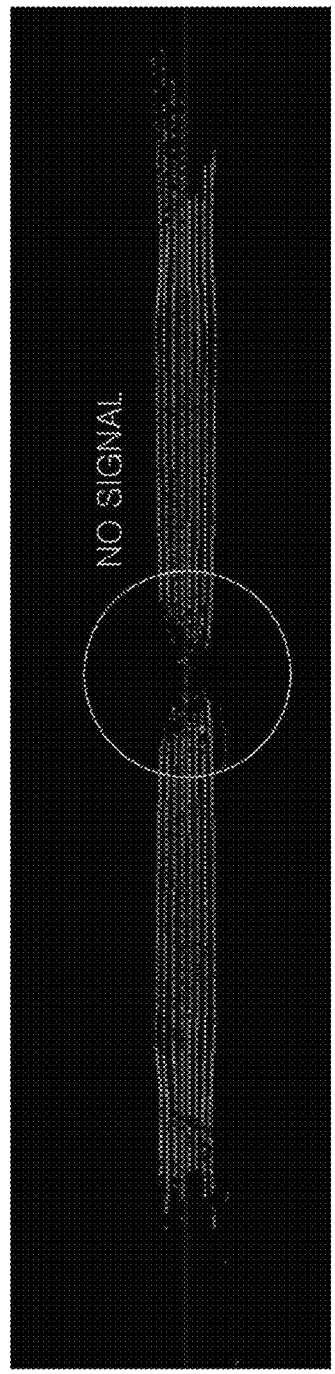
FIG. 13A is a diagram showing the evaluation result according to the Comparative Example 1.
Figure 13B:
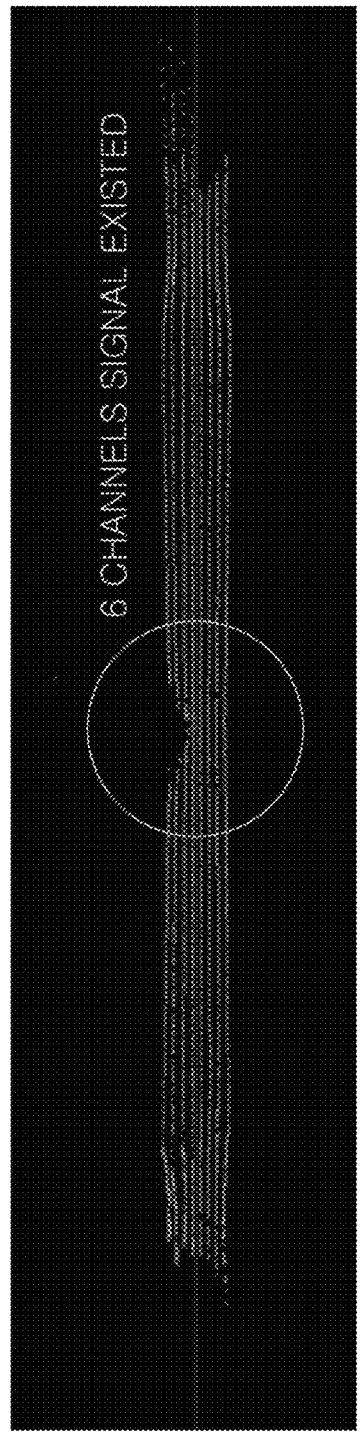
FIG. 13B is a diagram showing the evaluation result according to an embodiment of the present invention.

In addition, FIG. 13A shows the evaluation result of the Comparative Example 1 by the experimental configuration of FIG. 12, and FIG. 13B shows the evaluation result of an exemplary embodiment of the present invention by the experimental configuration of FIG. 12.

In the experiment, the illuminance of lighting used 5,500 to 5,800 cd, the illuminometer used CL200-A, the glossmeter used AG-446, and the artificial sunlight used SOLAX XC-500.

The artificial sunlight (S) acts as a noise to interfere with the normal operation of the LiDAR (L). The LiDAR uses the wavelength in the wavelength of 905 nm of infrared light, and APD also receives only the wavelength of 905 nm not to convert it into an electrical signal, and also changes some peripheral wavelengths into the electrical signal, thereby requiring high filter performance that selectively transmits only the wavelength of 905 nm at maximum in the optical filter.

It was confirmed that when the light reflected from the artificial sunlight (S) on the wall (W) was incident on the LiDAR L to act as a noise, in the case of the plastic cover having only the visible light absorption function, a LiDAR signal was cut off by the sunlight as in FIG. 13A. On the contrary, it was confirmed that when the optical filter according to the present invention was applied, a lot of noise was filtered out because only the band of 905 nm±100 nm was transmitted by the functions of infrared reflection and visible light absorption, and accordingly, as the result of evaluating an 8-channel LiDAR signal, the LiDAR signal survived 6 channels.

This means that when the LiDAR window integrated optical filter according to various exemplary embodiments of the present invention is used in an actual autonomous vehicle, the sensing performance may be significantly increased to ensure the safety of a driver and a pedestrian.

The LiDAR for experiment is an 8-channel LiDAR, and 8 channels (layers) are formed vertically. FIGS. 13A and 13B are screens viewed from the front of the LiDAR, and the green line is to indicate, by a dotted line, a signal through the point cloud technique by converting the infrared light of the LiDAR reflected to the target (wall surface) to return into an electrical signal.

As described above, according to the various exemplary LiDAR window integrated optical filter of the present invention, the cover itself may function as the optical filter without having to constitute the separate optical filter on the LiDAR, thereby reducing the manufacturing cost, and the like compared to the conventional one, and nonetheless, it is more effective for the LiDAR reception performance.

Although the present invention as described above has been described with reference to the exemplified drawings, it is not limited to the described embodiments, it is apparent by those skilled in the art that various modifications and changes may be made without departing from the spirit and scope of the present invention. Accordingly, the modified examples or changed examples should be included in the claims of the present invention, and the scope of the present invention should be interpreted based on the appended claims.

What is claimed is:

1. A light detection and ranging (LiDAR) window integrated optical filter, comprising:
a window comprising a polymer material;
an upper reflective layer formed on an upper surface of the window; and
a lower reflective layer formed on a lower surface of the window;
wherein the polymer material absorbs a visible light and transmits a near-infrared light,
wherein each of the upper reflective layer and the lower reflective layer is formed in a film comprising titanium dioxide ($TiO_2$) and silicon dioxide ($SiO_2$).

2. The LiDAR window integrated optical filter of claim 1, wherein the each of the upper reflective layer and the lower reflective layer are formed in a multilayer film by vapor deposition.

3. The LiDAR window integrated optical filter of claim 2, wherein the each of the upper reflective layer and the lower reflective layer is formed with the film by laminating a plurality of $SiO_2$ layers and $TiO_2$ layers.

4. The LiDAR window integrated optical filter of claim 3, wherein a thickness of the upper reflective layer is about 4 to 7 μm.

5. The LiDAR window integrated optical filter of claim 3, wherein the upper reflective layer is deposited as a multilayer structure of 25 to 30 layers.

6. The LiDAR window integrated optical filter of claim 5, wherein the upper reflective layer reflects infrared light having a wave length of about 1,400 to 1,600 nm.

7. The LiDAR window integrated optical filter of claim 3, wherein a thickness of the lower reflective layer is about 4 to 7 μm.

8. The LiDAR window integrated optical filter of claim 7, wherein the lower reflective layer is deposited as a multilayer structure of 25 to 30 layers.

9. The LiDAR window integrated optical filter of claim 8, wherein the lower reflective layer reflects infrared light having a wavelength of about 1,100 to 1,400 nm.

10. The LiDAR window integrated optical filter of claim 3, wherein a thickness difference between the upper reflective layer and the lower reflective layer is less than about 2 μm.

11. The LiDAR window integrated optical filter of claim 3, wherein the window comprises a transparent plastic material comprising a visible light absorbing material added thereto, and has a thickness of about 2 to 4 mm.

12. The LiDAR window integrated optical filter of claim 3, wherein the transmittance at a wavelength of 905 nm is about 90% or greater.

13. The LiDAR window integrated optical filter of claim 12, wherein the transmittance at a wavelength of 1,550 nm is about 1% or less.

14. A light detection and ranging (LiDAR) window integrated optical filter, comprising:

a window comprising a polymer material absorbing visible light having a wavelength of about 350 nm to 780 nm;

an upper reflective layer laminated on an upper surface of the window to reflect infrared light having a wavelength of about 1,400 to 1,600 nm; and a lower reflective layer laminated on the lower surface of the window to reflect infrared light having a wavelength of about 1,100 to 1,400 nm.

15. The LiDAR window integrated optical filter of claim 14, wherein the transmittance at a wavelength of about 905 nm is about 90% or greater.

16. The LiDAR window integrated optical filter of claim 15, wherein the transmittance at a wavelength of 1,550 nm is about 1% or less.

* * * * *